US011211378B2

(12) United States Patent
Farooq et al.

(10) Patent No.: US 11,211,378 B2
(45) Date of Patent: Dec. 28, 2021

(54) HETEROGENEOUS INTEGRATION STRUCTURE FOR ARTIFICIAL INTELLIGENCE COMPUTING

(71) Applicant: INTERNATIONAL BUSINESS MACHINES CORPORATION, Armonk, NY (US)

(72) Inventors: Mukta G. Farooq, Hopewell Junction, NY (US); Arvind Kumar, Chappaqua, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/515,877

(22) Filed: Jul. 18, 2019

(65) Prior Publication Data

US 2021/0020627 A1 Jan. 21, 2021

(51) Int. Cl.
*H01L 25/065* (2006.01)
*H01L 27/06* (2006.01)
*H01L 27/24* (2006.01)

(52) U.S. Cl.
CPC ...... *H01L 27/0688* (2013.01); *H01L 25/0657* (2013.01); *H01L 27/249* (2013.01); *H01L 2225/06541* (2013.01)

(58) Field of Classification Search
CPC .......................... H01L 25/0657; H01L 27/0688
See application file for complete search history.

(56) References Cited

U.S. PATENT DOCUMENTS

| 5,563,086 A | 10/1996 | Bertin et al. |
| 9,153,520 B2 | 10/2015 | Groothuis et al. |
| 9,508,704 B2 | 11/2016 | Chung et al. |
| 9,588,717 B2 | 3/2017 | Lo et al. |
| 2006/0279000 A1* | 12/2006 | Chang .................. H05K 3/4007 257/779 |

(Continued)

FOREIGN PATENT DOCUMENTS

| CN | 108807347 A | 11/2018 |
| CN | 109508316 A | 3/2019 |
| KR | 1020140023706 A | 2/2014 |

OTHER PUBLICATIONS

Fleischer et al., "A Scalable Multi-TeraOPS Deep Learning Processor Core for AI Training and Inference", 2018 Symposium on VLSI Circuits Digest of Technical Papers, Apr. 2018, pp. 35-36.

(Continued)

*Primary Examiner* — Grant S Withers
(74) *Attorney, Agent, or Firm* — Tutunjian & Bitetto, P.C.; L. Jeffrey Kelly

(57) ABSTRACT

Three-dimensional (3D) semiconductor memory structures and methods of forming 3D semiconductor memory structures are provided. The 3D semiconductor memory structure includes a chip comprising a memory and Through-Silicon Vias (TSVs). The 3D semiconductor memory structure further includes a hardware accelerator arranged on and coupled face-to-face to the above chip. The 3D semiconductor memory structure also includes a substrate arranged under the under the (3D) semiconductor memory structure and the hardware accelerator and attached to the TSVs and external inputs and outputs of the memory chip and the hardware accelerator.

13 Claims, 8 Drawing Sheets

(56) References Cited

U.S. PATENT DOCUMENTS

| | | |
|---|---|---|
| 2010/0032820 A1 | 2/2010 | Bruennert et al. |
| 2010/0140779 A1* | 6/2010 | Lin .................... H01L 23/5389 |
| | | 257/690 |
| 2012/0074585 A1* | 3/2012 | Koo .................. H01L 23/49827 |
| | | 257/774 |
| 2012/0104623 A1* | 5/2012 | Pagaila ............... H01L 25/0657 |
| | | 257/774 |
| 2015/0242308 A1 | 8/2015 | Kim et al. |
| 2016/0379686 A1 | 12/2016 | Burger et al. |
| 2018/0176006 A1* | 6/2018 | McElheny .......... H01L 25/0657 |
| 2019/0042920 A1 | 2/2019 | Akin et al. |
| 2019/0043882 A1 | 2/2019 | Hasnat et al. |

OTHER PUBLICATIONS

Gao et al., "TETRIS: Scalable and Efficient Neural Network Acceleration with 3D Memory", ASPLOS '17,, Apr. 2017, pp. 751-764.
Kim et al., "Neurocube: A Programmable Digital Neuromorphic Architecture with High-Density 3D Memory", 2016 ACM/IEEE 43rd Annual International Symposium on Computer Architecture, Jun. 2016, pp. 380-392.
International Search Report issued in International Application No. PCT/IB2020/055605 dated Sep. 29, 2020, pp. 1-9.

\* cited by examiner

HETEROGENEOUS INTEGRATION STRUCTURE FOR ARTIFICIAL INTELLIGENCE COMPUTING

BACKGROUND

The present invention generally relates to machine learning, and more particularly to a heterogeneous integration structure for artificial intelligence.

The increasing prevalence of artificial intelligence workloads is driving the need for specialized accelerators with high bandwidth interconnectivity to memory. As these accelerators continue to improve, overall system performance will suffer unless the external bandwidth is able to supply data to the compute engines fast enough.

Thus, high bandwidth communication is required between accelerator and memory chips. Conventional integration methods using so-called 2.5D integration in which chips are joined to a Si interposer by solder interconnects are difficult to scale and costly. The scalability of a Si interposer solution is limited both by the number of pins on each chip and by the number of chips that can be placed on a Si interposer. Additionally, if High Bandwidth Memories (HBMs) are to be employed to enable high capacity memory, then a HBM PHY interface must be located at close proximity to the accelerator chip. These competing but equally important requirements create both spatial configuration challenges as well as integration challenges which must be overcome. Hence, there is a need for a solution for high bandwidth communication between memory and accelerators that overcomes the preceding issues.

SUMMARY

According to an aspect of the present invention, a three-dimensional (3D) semiconductor memory structure is provided. The 3D semiconductor memory structure includes a chip comprising a memory and Through-Silicon Vias (TSVs). The 3D semiconductor memory structure further includes a hardware accelerator arranged on and coupled face-to-face to the above chip. The 3D semiconductor memory structure also includes a substrate arranged under the under the (3D) semiconductor memory structure and the hardware accelerator and attached to the TSVs and external inputs and outputs of the memory chip and the hardware accelerator.

According to another aspect of the present invention, a method is provided for forming a three-dimensional (3D) semiconductor memory structure. The method includes receiving a chip comprising a memory and Through-Silicon Vias (TSVs). The method further includes arranging a hardware accelerator on and coupled face-to-face to the above chip. The method also includes arranging a substrate under the under the (3D) semiconductor memory structure and the hardware accelerator and attaching to the TSVs and external inputs and outputs of the memory chip and the hardware accelerator.

According to yet another aspect of the present invention, a three-dimensional (3D) semiconductor memory structure is provided. The 3D semiconductor memory structure includes a memory chip comprising a memory and Through-Silicon Vias (TSVs). The 3D semiconductor memory structure further includes a hardware accelerator arranged on and coupled to the chip. The 3D semiconductor memory structure also includes an analog chip, arranged between the chip and the hardware accelerator and coupled face-to-face to the hardware accelerator. The 3D semiconductor memory structure additionally includes a substrate arranged under the under the (3D) semiconductor memory structure, the hardware accelerator, and the analog chip, and attached to the TSVs and external inputs and outputs of the memory chip and the hardware accelerator.

According to still another aspect of the present invention, a method is provided for forming a three-dimensional (3D) semiconductor memory structure. The method includes receiving a memory chip comprising a memory and Through-Silicon Vias (TSVs). The method further includes arranging a hardware accelerator on and coupled to the memory chip. The memory also includes arranging an analog chip between the wafer and the hardware accelerator and coupled face-to-face to the hardware accelerator. The memory additionally includes arranging a substrate under the under the (3D) semiconductor memory structure, the hardware accelerator, and the analog chip, and attached to the TSVs and external inputs and outputs of the memory chip and the hardware accelerator.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

The present invention is directed to a heterogeneous integration structure for artificial intelligence.

In an embodiment, the present invention provides a new structure able to leverage the benefits of three-dimensional (3D) arrangements while overcoming its challenges.

In an embodiment, the present invention provides an accelerator stacked on top of a memory. Placing the accelerator on top of the memory enables efficient cooling of the accelerator.

In an embodiment, signal and power delivery is achieved through Through-Silicon Vias (TSVs) (e.g., throughout or at the periphery) of a MemPower chip (e.g., a memory coupled to an extended frame for TSVs, e.g., including power and non-power TSVs), thus not impacting an above area having computation cores (e.g., of an accelerator) residing thereat. By arranging the accelerator at the top of the resultant structure, it provides the opportunity to directly cool the accelerator, and advanced thermal techniques and their associated costs and deficiencies can be avoided.

In an embodiment, extremely high bandwidth can be achieved between computation cores and memory, at a lower power versus an interposer arrangement (e.g., an arrangement with lateral connections between the accelerator and memory over relatively long distances) due to shorter vertical connections.

In an embodiment, potential thermal issues are avoided and/or otherwise alleviated by placing a higher power compute chip (e.g., an accelerator chip) on top, adjacent to a heat sink (not shown).

In an embodiment, the present invention decouples technologies needed for computation versus memory and Input/Output (I/O).

In an embodiment, supplemental memory can be added to provide a high-bandwidth connection to the memory portion of the MemPower chip.

Figure 1:
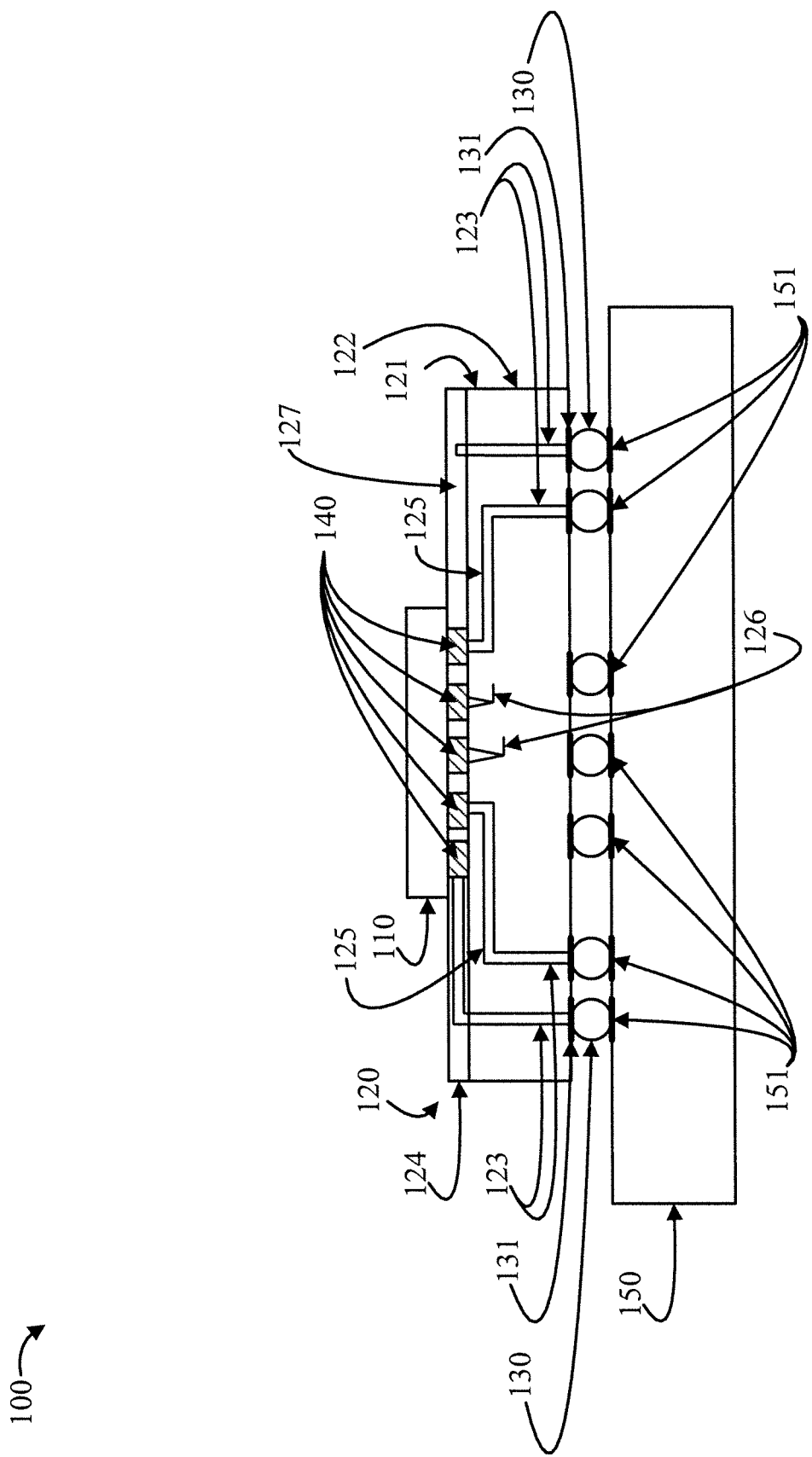
FIG. 1 is a diagram showing an exemplary heterogeneous integration structure for artificial intelligence computing, in accordance with an embodiment of the present invention.

FIG. 1 is a diagram showing an exemplary heterogeneous integration structure 100 for artificial intelligence computing, in accordance with an embodiment of the present invention.

The structure 100 includes an accelerator chip 110 (hereinafter "accelerator") and a MemPower chip 120. In structure 100, accelerator 110 is arranged at the top in order to efficiently cool accelerator 110, and avoid the need for advanced cooling techniques to cool accelerator 110. The MemPower chip 120 includes a memory portion, implemented as a memory chip 121, and further includes an expanded frame 122 for power Through-Silicon Vias 123 (TSVs). The accelerator 110 is arranged face-to-face (F2F) on, and connected to, MemPower chip 120.

The MemPower chip 120 also includes a memory BEOL inter-layer dielectric (ILD) 124, memory thick wire BEOL wiring 125, and memory fine wire BEOL wiring 126.

In an embodiment, MemPower chip 120 is thinned (e.g., 50-100 um nominally), the TSVs 123 are capped, and solder bumps 130 are attached to the TSVs 123 (on the backside) via pads 131 as well as to dummy pads 151 on a packaging substrate 150 for uniformity/coplanarity.

The TSVs 123 carry power from a laminate on packaging substrate 150 to memory chip 121 and via a BEOL Redistribution Layer (RDL) 127 to accelerator 110.

The TSVs 123 may be formed up to the last but one thick BEOL level of MemPower chip 120. Such an arrangement is the least disruptive to an existing memory design. Accordingly, modification can be limited to only in the top thick wire BEOL levels (one or two top levels) of MemPower chip 120. Thick wires are redistributed on the top one or two levels of MemPower chip 120 to carry power to perimeter locations (or other locations as needed) on accelerator 110.

The MemPower chip 120 is joined to accelerator 110 using fine interconnections 140, e.g., Cu—Cu bond [e.g., but not limited to, 5 um pad/10 um pitch]. Such an arrangement enables rapid access to memory chip 121 by accelerator 110. Moreover, such an arrangement enables very high bandwidth where it is most needed.

Figure 2:
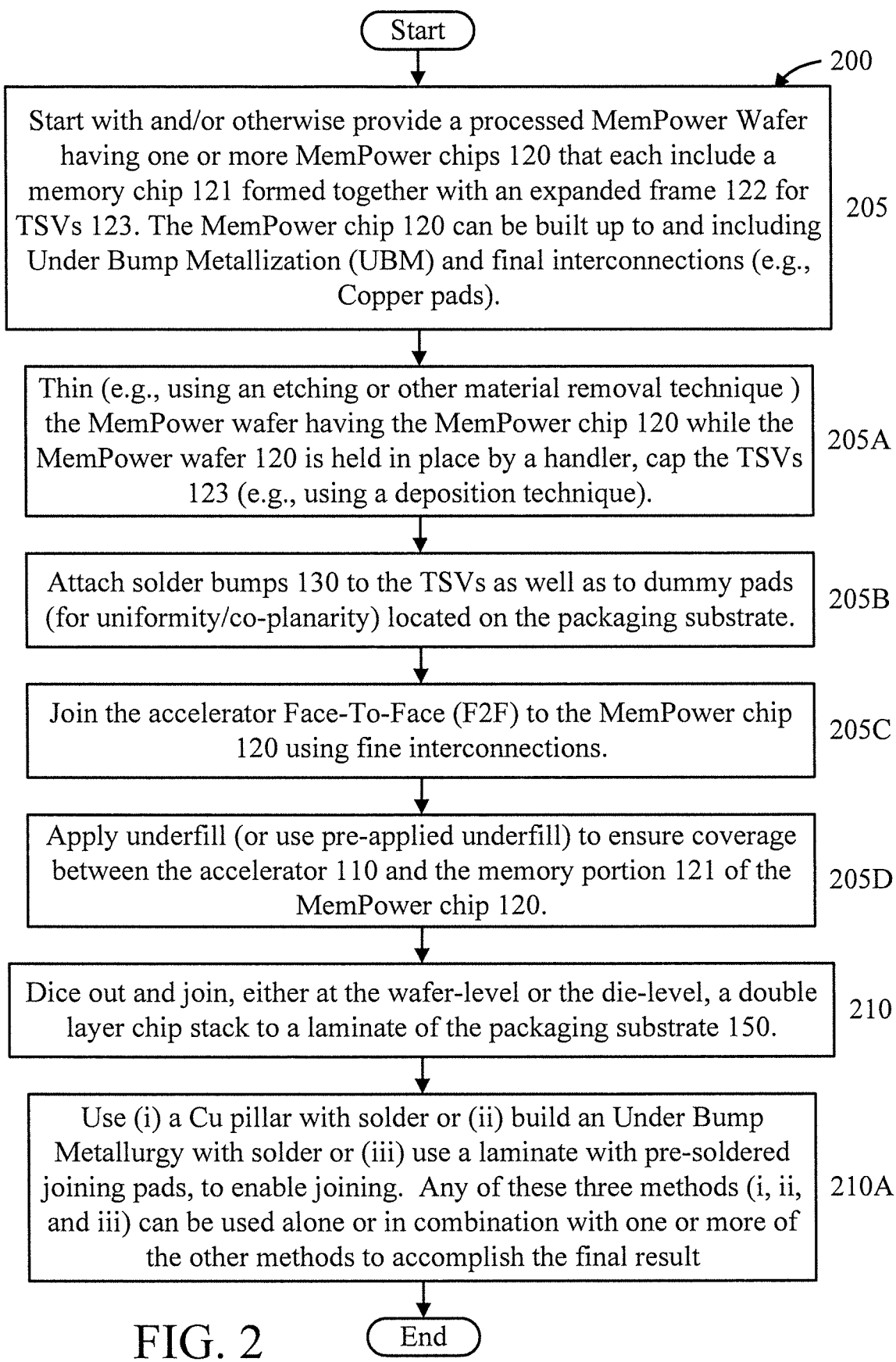
FIG. 2 is a flow diagram describing an exemplary method of forming the heterogeneous integration structure of FIG. 1, in accordance with an embodiment of the present invention.

FIG. 2 is a flow diagram describing an exemplary method 200 of forming the heterogeneous integration structure 100 of FIG. 1, in accordance with an embodiment of the present invention.

At block 205, start with and/or otherwise provide a processed MemPower Wafer having one or more MemPower chips 120 that each include a memory chip 121 formed together with an expanded frame 122 for TSVs 123. For the sake of illustration and clarity, the MemPower wafer is hereinafter described as having a single MemPower chip 120. The memory design, that is, memory portion, of the memory chip 121 can be used all the way up to the last but one BEOL thick wire level. The reticle size can be increased by a small amount to accommodate TSV rows around the perimeter of the memory chip 121. The MemPower chip 120 can be built up to and including Under Bump Metallization (UBM) and final interconnections (e.g., Copper (Cu) pads).

In an embodiment, one method of constructing the MemPower wafer is to use a memory wafer and add TSVs to the peripheral regions. These TSVs may be added at any point in the build process, such as the front-end of line, the middle of line or the back-end of line. The TSVs may be connected to the memory using back-end of line wiring.

In an embodiment, block 205 can include one or more of blocks 205A through 205D.

At block 205A, thin (e.g., using an etching or other material removal technique (e.g., polishing, planarization, Chemical Mechanical Polishing/Planarization (CMP), etc.)) the MemPower wafer having the MemPower chip 120 (50-100 um nominal final wafer thickness) while the MemPower wafer is held in place by a handler, cap the TSVs 123 (e.g., using a deposition technique). No solder bumps are attached at this point (block 305A)

At block 205B, attach solder bumps 130 to the TSVs as well as to dummy pads (for uniformity/co-planarity) located on the packaging substrate.

At block 205C, join the accelerator Face-To-Face (F2F) to the MemPower chip 120 using fine interconnections.

At block 205D, apply underfill (or use pre-applied underfill) to ensure coverage between the accelerator 110 and the memory portion 121 of the MemPower chip 120.

If this is a reconstituted wafer, then the post dice operation enables selection and placement of a near full thickness (~785 um) double chip stack.

At block 210, dice out and join, either at the wafer-level or the die-level, a double layer chip stack to a laminate of the packaging substrate 150.

In an embodiment, block 210 can include block 210A. It is to be appreciated that block 210A is performed when block 205B is not performed.

At block 210A, use (i) a Cu pillar with solder or (ii) build an Under Bump Metallurgy with solder or (iii) use a laminate with pre-soldered joining pads, to enable joining. Any of these three methods (i, ii, and iii) can be used alone or in combination with one or more of the other methods to accomplish the final result The Cu pillar method gives the added advantage of a standoff (i.e., lower strain and therefore lower Chip-Package Interaction (CPI) stresses between the two chip stacks and the packaging substrate (typically a 12-15 ppm/C Coefficient of Thermal Expansion (CTE) mismatch).

Figure 3:
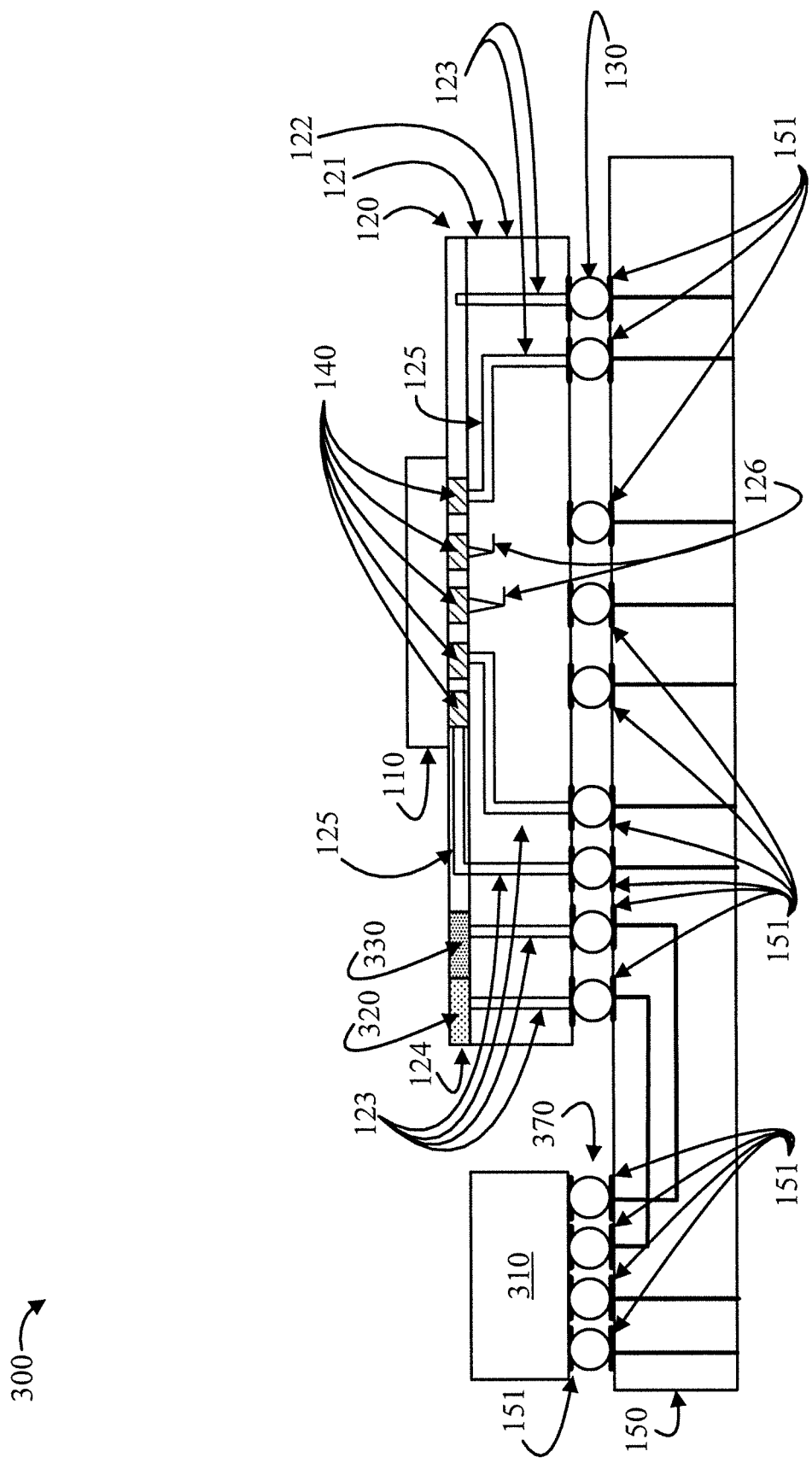
FIG. 3 is a diagram showing an exemplary heterogeneous integration structure for artificial intelligence computing using a High Bandwidth Memory (HBM), in accordance with an embodiment of the present invention.

FIG. 3 is a diagram showing an exemplary heterogeneous integration structure 400 for artificial intelligence computing using a High Bandwidth Memory (HBM), in accordance with an embodiment of the present invention.

Structure 300 is similar to structure 100 of FIG. 1, but further includes a supplemental memory (a High Bandwidth Memory (HBM)) 310, a PHY 320, and a memory controller 330 on the MemPower chip 120. The HBM 310 can be joined to the laminate for increased memory capacity.

The PHY 320 and memory controller 330 for the supplemental HBM 310 can be placed on the MemPower chip 120, enabling the memory chip 121 on the MemPower chip 120 to load/store data efficiently with the supplemental HBM 310. In an embodiment, the memory controller 330 can be used to control memory operations of the memory chip 121 and the supplemental HBM 310. The PHY 320 can include communication channels, power and data management capabilities, test capabilities, and so forth.

The HBM 310 can be accommodated using a thin-film laminate or other high-density packaging substrate which supports the fine pitch requirements (55 um pitch) of the PHY 320.

The HBM 310 is attached to the packaging substrate 510 using microbumps 370.

Figure 4:
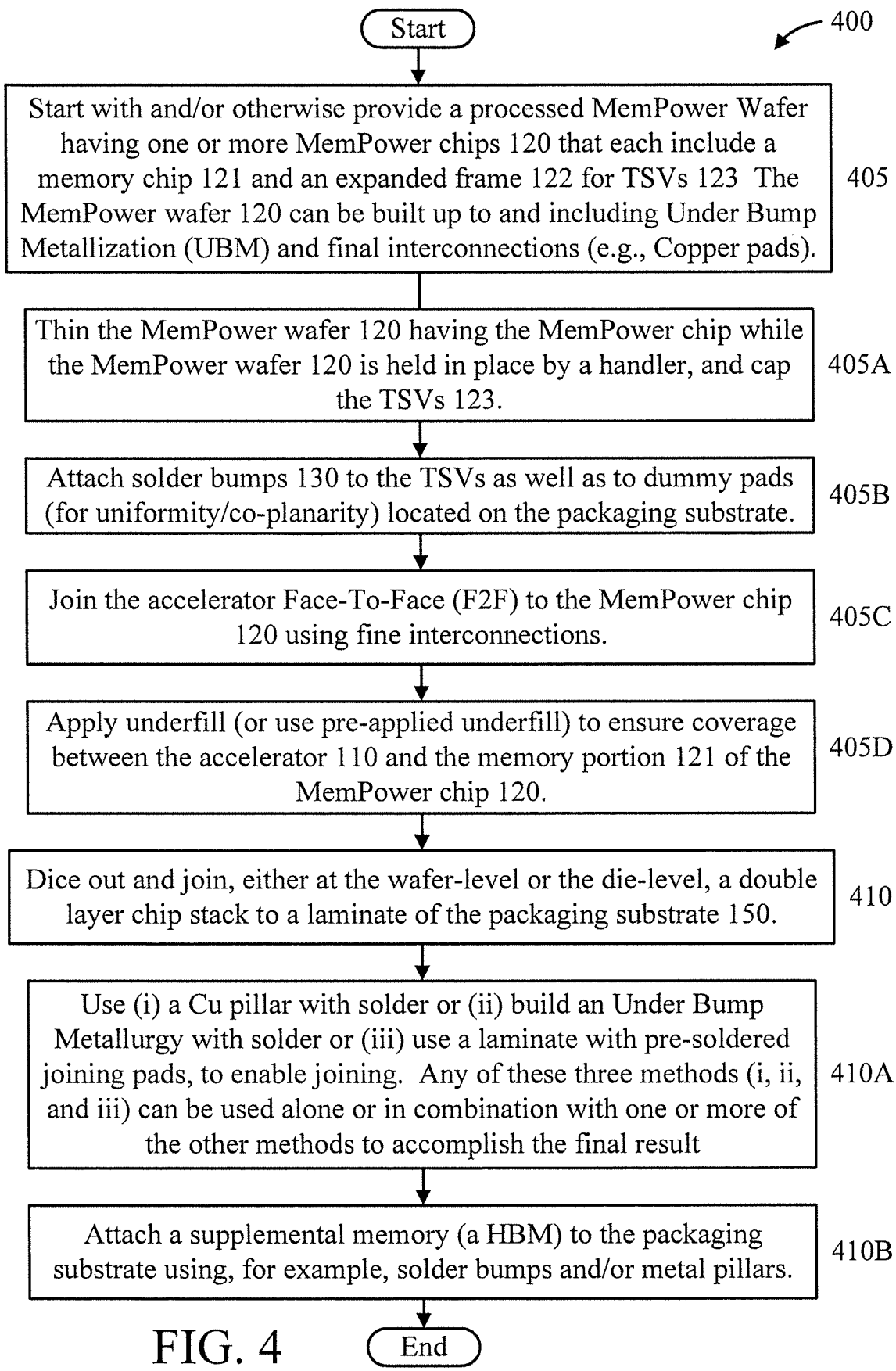
FIG. 4 is a flow diagram showing an exemplary method of forming the heterogeneous integration structure of FIG. 3, in accordance with an embodiment of the present invention.

FIG. 4 is a flow diagram showing an exemplary method 400 of forming the heterogeneous integration structure 300 of FIG. 3, in accordance with an embodiment of the present invention.

At block 405, start with and/or otherwise provide a processed MemPower Wafer having one or more MemPower chips 120 that each include a memory chip 121 and an expanded frame 122 for TSVs 123. For the sake of illustration and clarity, the MemPower wafer is hereinafter described as having a single MemPower chip 120. The memory design, that is, memory portion, of memory chip 121 can be used all the way up to the last but one BEOL thick wire level. The reticle size can be increased by a small amount to accommodate TSV rows around the perimeter of memory chip 121. The MemPower chip 120 can be built up to and including Under Bump Metallization (UBM) and final interconnections (e.g., Copper (Cu) pads).

In an embodiment, block 405 can include one or more of blocks 405A through 405D.

At block 405A, thin (e.g., using an etching or other material removal technique (e.g., polishing, planarization, Chemical Mechanical Polishing/Planarization (CMP), etc.)) the MemPower wafer having the MemPower chip 120 (50-100 um nominal final wafer thickness) while the MemPower wafer 120 is held in place by a handler, cap the TSVs 123 (e.g., using a deposition technique).

At block 405B, attach solder bumps 130 to the TSVs as well as to dummy pads (for uniformity/co-planarity) located on the packaging substrate.

At block 405C, join the accelerator Face-To-Face (F2F) to the MemPower chip 120 using fine interconnections (e.g., Cu-to-Cu).

At block 405D, apply underfill (or use pre-applied underfill) to ensure coverage between the accelerator 110 and the memory portion 121 of the MemPower chip 120.

If this is a reconstituted wafer, then the post dice operation enables selection and placement of a near full thickness (~785 um) double chip stack.

At block 410, dice out and join, either at the wafer-level or the die-level, a double layer chip stack to a laminate of the packaging substrate 150.

In an embodiment, block 410 can include one or more of blocks 410A and 410B. It is to be appreciated that block 410A is performed when block 405B is not performed.

At block 410A, use (i) a Cu pillar with solder or (ii) build an Under Bump Metallurgy with solder or (iii) use a laminate with pre-soldered joining pads, to enable joining. Any of these three methods (i, ii, and iii) can be used alone or in combination with one or more of the other methods to accomplish the final result. The Cu pillar method gives the added advantage of a standoff (i.e., lower strain and therefore lower Chip-Package Interaction (CPI) stresses between the two chip stacks and the packaging substrate (typically a 12 ppm/C Coefficient of Thermal Expansion (CTE) mismatch).

At block 410B, attach a supplemental memory (a HBM) to the packaging substrate using, for example, fine connections.

Figure 5:
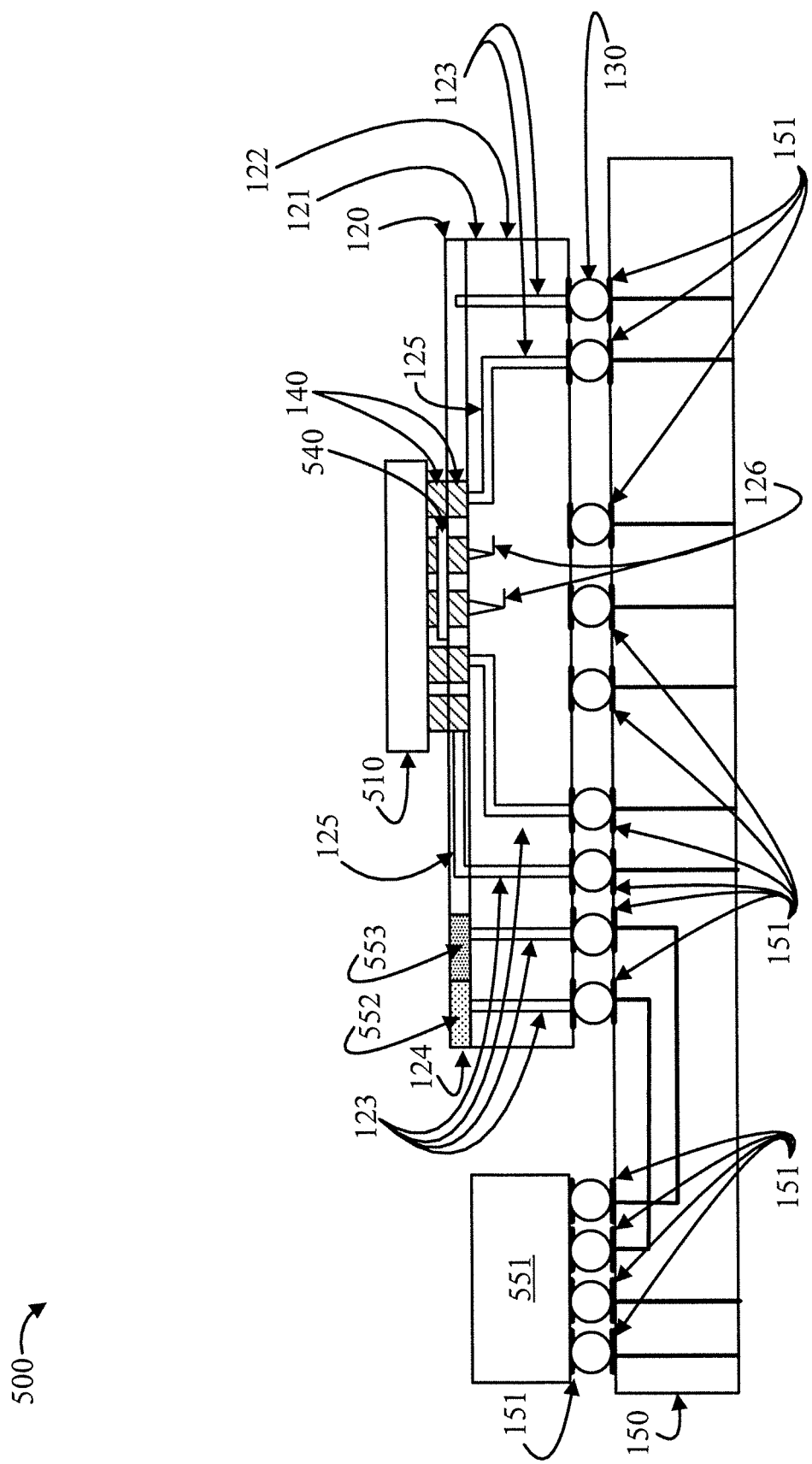
FIG. 5 is a diagram showing an exemplary heterogeneous integration structure having an analog die joined to a main accelerator die, in accordance with an embodiment of the present invention.

FIG. 5 is a diagram showing an exemplary heterogeneous integration structure 500 having an analog die joined to a main accelerator die, in accordance with an embodiment of the present invention.

The heterogeneous integration structure 500 includes a main accelerator 510 (hereinafter interchangeably "hardware accelerator" or "main accelerator" or "main die"), a MemPower chip 120, and an analog die 540, a supplemental memory (a High Bandwidth Memory (HBM)) 551, a PHY 552, and a memory controller 553. In an embodiment, the main accelerator is a digital accelerator. In the structure 500, the main accelerator 510 is arranged at the top in order to provide efficient cooling of the main accelerator 510, and avoid the need for advanced cooling techniques to cool the main accelerator 510.

In an embodiment, the analog die 540 can implement an accelerator such as, for example, but not limited to, a Resistive Processing Unit (RPU)-based accelerator. Of course, other types of analog-based accelerators can be used, while maintaining the spirit of the present invention. An Analog-to-Digital Converter(s) (ADC(s)) can be disposed on the analog die 540 or the main accelerator 510 to convert analog signals of the analog die 540 to digital signals. The ADC(s) can be connected to outputs of current integrators coupled to the columns of a cross-point array of RPU devices forming the RPU-based accelerator. The RPU-based accelerator can be used to accelerate the training of a deep neural network. These and other applications are readily contemplated by one of ordinary skill in the art, while maintaining the spirit of the present invention.

The MemPower chip 120 includes a memory portion, implemented as a memory chip 121, and further includes an expanded frame 122 for power Through-Silicon Vias 123 (TSVs). The main accelerator 510 is connected to the MemPower chip 120 and to the analog die 540 to form an intermediate structure that is attached to a thin film or other high density packaging substrate or Si interposer 591. The involved attachments of structure 500 are described below.

Very fine pitch Cu—Cu interconnections (<50 um pitch) are used for the main accelerator/analog chip interconnections (that is, to connect the main accelerator 510 to the analog chip 540).

Fine pitch Cu pillars and solder cap interconnections can be used for the main accelerator/MemPower chip interconnections (that is, to connect the main accelerator 510 to the MemPower chip 120).

Fine pitch Cu pillar and solder cap (55 um pitch) interconnections can be used for the HBM/laminate interconnections (that is, to connect the HBM 551 to (a laminate of) thin film or other high density packaging substrate or Si interposer 591).

Fine pitch Cu pillar and solder cap (55 um pitch) can be used to attach the intermediate structure of the main accelerator joined with the MemPower chip to the thin film or other high-density packaging substrate or Si interposer 691.

The PHY 552 and memory controller 553 are on the MemPower chip 120. The HBM 510 can be joined to the laminate for increased memory capacity as described above.

The analog die 540 may be thinned, but may not include any TSVs. The analog die 540 is joined F2F with the memory chip 120.

The analog die 540 directly communicates with the main accelerator 510, and derives power from the main accelerator 510.

The main accelerator 510 communicates with the analog die 540, and derives power from the MemPower chip 120.

Figure 6:
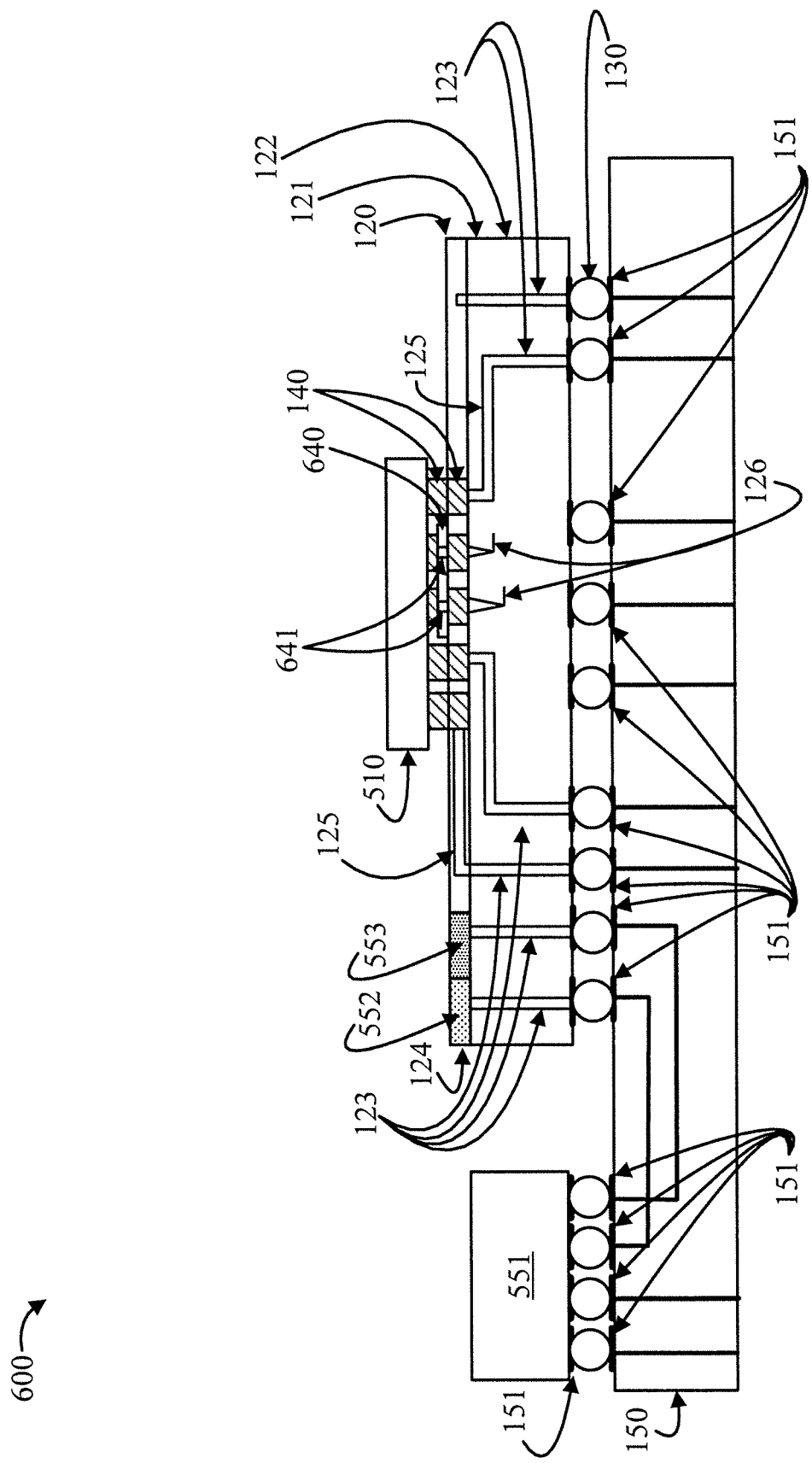
FIG. 6 is a diagram showing another exemplary heterogeneous integration structure 600 having an analog die joined to a main accelerator die, in accordance with an embodiment of the present invention.

FIG. 6 is a diagram showing another exemplary heterogeneous integration structure 600 having an analog die joined to a main accelerator die, in accordance with an embodiment of the present invention. Structure 600 differs from structure 500 in that the analog chip 540 in structure 500 is thinned and includes TSVs in order to form analog chip 640 for the embodiment of FIG. 6.

The main die is implemented by main accelerator 510.

In structure 600, analog chip 640 is thinned and has TSVs 641.

The analog chip 640 is closest to the memory chip 121, but communicates with both the memory chip 121 and the main accelerator 510 directly.

The main accelerator 510 communicates with analog chip 640 and derives power from MemPower chip 120.

The analog chip 640 directly communicates with main accelerator 510, and derives power from main accelerator 510.

Figure 7:
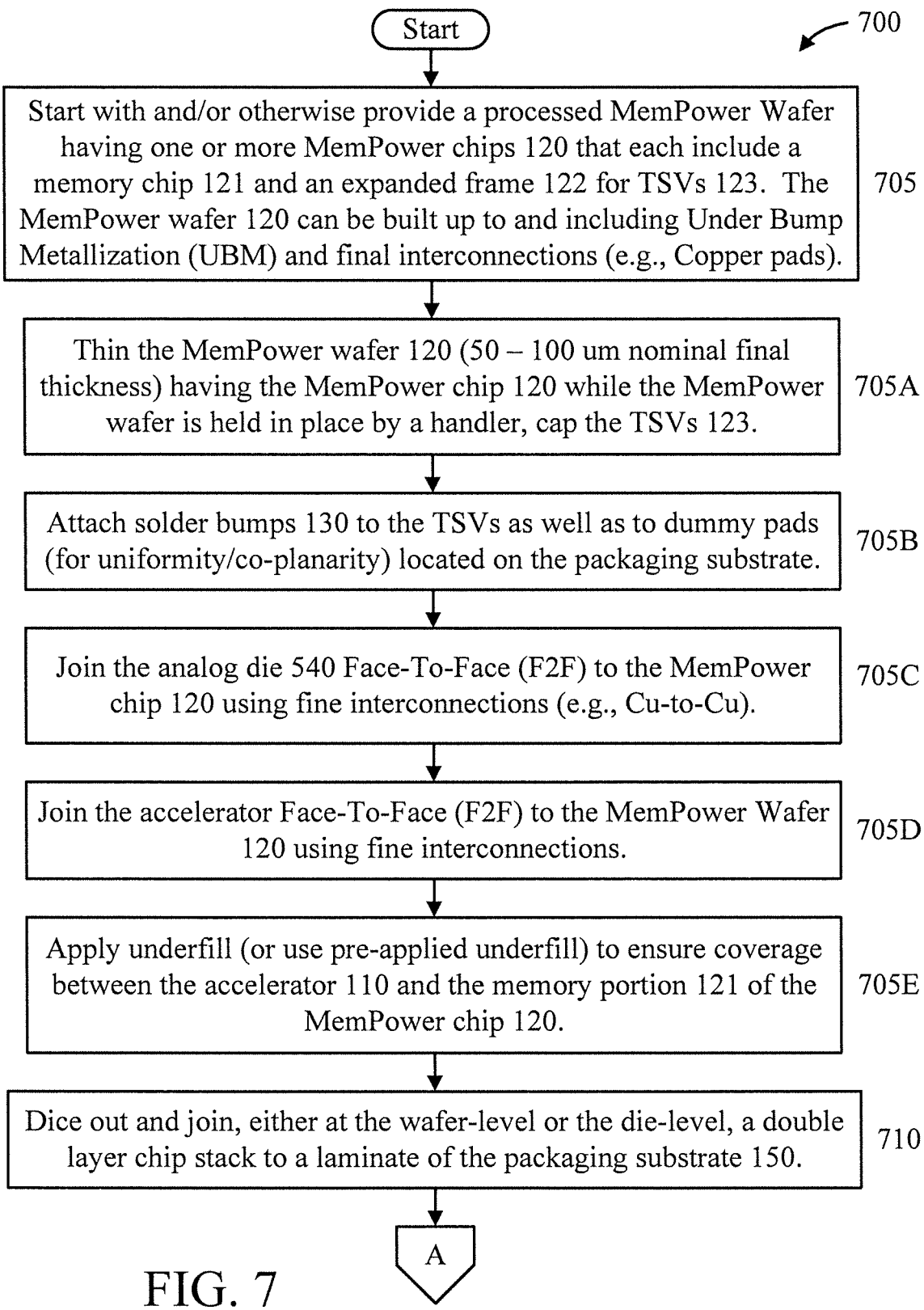
FIGS. 7-8 are flow diagrams showing an exemplary method of forming the heterogeneous integration structures of FIGS. 5 and 6, in accordance with an embodiment of the present invention.
Figure 8:
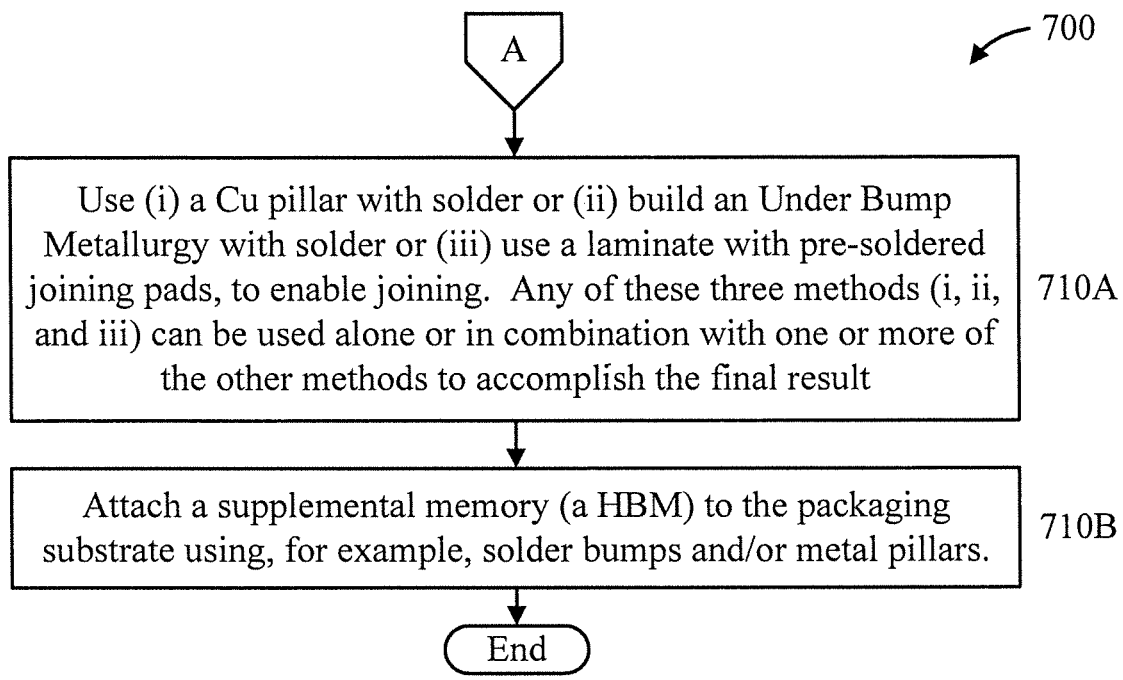

FIGS. 7-8 are flow diagrams showing an exemplary method 700 of forming the heterogeneous integration structures of FIGS. 5 and 6, in accordance with an embodiment of the present invention.

At block 705, start with and/or otherwise provide a processed MemPower Wafer having one or more MemPower chips 120 that each include a memory chip 121 and an expanded frame 122 for TSVs 123. For the sake of illustration and clarity, the MemPower wafer is hereinafter described as having a single MemPower chip 120. The expanded frame 122 for TSVs 123 can be implemented as a TSV chip. The memory design, that is, memory portion, of memory chip 121 can be used all the way up to the last but one BEOL thick wire level. The reticle size can be increased by a small amount to accommodate TSV rows around the perimeter of memory chip 121. The MemPower chip 120 can be built up to and including Under Bump Metallization (UBM) and final interconnections (e.g., Copper (Cu) pads).

In an embodiment, block 705 can include one or more of blocks 705A through 705E.

At block 705A, thin the MemPower wafer 120 (50-100 um nominal final thickness) having the MemPower chip 120 while the MemPower wafer is held in place by a handler, cap the TSVs 123.

At block 705B, attach solder bumps 130 to the TSVs as well as to dummy pads (for uniformity/co-planarity) located on the packaging substrate.

At block 705C, join the analog die 540 Face-To-Face (F2F) to the MemPower chip 120 using fine interconnections (e.g., Cu-to-Cu).

At block 705D, join the main accelerator 510 to the MemPower chip 120 using fine interconnections (e.g., Cu-to-Cu) and to the analog die using very fine interconnections (e.g., Cu-to-Cu, Grade 1), such that the analog die is arranged between the main accelerator 510 and the memory chip 221 of the MemPower chip 120.

At block 705E, apply underfill (or use pre-applied underfill) to ensure coverage between the main accelerator 510, the analog die 540, and the memory portion 121 of the MemPower chip 120.

If this is a reconstituted wafer, then the post dice operation enables selection and placement of a near full thickness (~785 um) double chip stack.

At block 710, dice out and join, either at the wafer-level or the die-level, a double layer chip stack to a laminate of the packaging substrate 150.

In an embodiment, block 710 can include one or more of blocks 710A and 710B. It is to be appreciated that block 710A is performed when block 705B is not performed.

At block 710A, use (i) a Cu pillar with solder or (ii) build an Under Bump Metallurgy with solder or (iii) use a laminate with pre-soldered joining pads, to enable joining. Any of these three methods (i, ii, and iii) can be used alone or in combination with one or more of the other methods to accomplish the final result. The Cu pillar method gives the added advantage of a standoff (i.e., lower strain and therefore lower Chip-Package Interaction (CPI) stresses between the two chip stacks and the packaging substrate (typically a 12 ppm/C Coefficient of Thermal Expansion (CTE) mismatch).

At block 710B, attach a supplemental memory (a HBM) to the packaging substrate using, for example, fine connections.

A description will now be given regarding a Cu-to-Cu pillar bonding technique that can used by one or more embodiments of the present invention. Reference herein to fine or very fine connections can refer to this Cu-to-Cu pillar bonding technique.

Initially, a trench is formed in a substrate or other material. The trench preferably has a V-shape with a flat, instead of pointed, bottom. A seed layer is deposited over the trench. A copper layer is deposited over the seed layer. A copper pillar is formed and/or otherwise placed in the trench. Mechanical, thermal, or other means may be used to join the copper pillar to the copper of the trench in order to form an electrical connection.

A description will now be given regarding Under Bump Metallization (UBM), aka Under Bump Metallization, used in accordance with one or more embodiments of the present invention.

Traditionally, solder bumps (also referred to as "solder balls"), such as C4 (controlled collapse chip connection) bumps, have been used to bond a chip to a chip carrier. The term "solder", as used herein, refers to any metal or metallic compound or alloy that is melted and then allowed to cool in order to join two or more metallic surfaces together. Generally speaking, solders have melting temperatures in the range of 150° C. to 250° C. Solder bumps may be small spheres of solder (solder balls) that are bonded to contact areas, interconnect lines or pads of semiconductor devices. In some embodiments, the solder bumps can be made from lead-free solder mixtures or lead tin solder.

Ball limiting metallurgy (BLM) (also referred to as "under ball metallurgy (UBM)") is a solder wettable terminal metallurgy that defines the size and area of the soldered connection between the solder ball and the component that the solder ball is to be place in electrical communication with. The BLM limits the flow of the solder ball to the desired area. In some embodiments, the BLM provides adhesion and contact to the chip wiring. In some examples, the BLM may include an adhesive layer, a barrier layer and a conductive layer that provides a path for interconnection between the device back end of line structures, and the electrical structures to be connected to the device back end of the line structures, using a solder bump. The adhesive layer, the barrier layer and the conductive player provide a path for interconnection between the device and the chip.

The adhesive layer can be metals like titanium (Ti) or an alloy of titanium (Ti) and tungsten (W). The barrier layer can be composed of nickel (Ni). The main conductive layer is typically copper (Cu). A typical plated BLM layer may consist of a metal stack including a sputtered Ti and W alloy layer, a sputtered Cu layer, a plated Ni layer and a plated Cu layer. This process includes subtractive etching of the copper seed layer. In this process, some of the top layer of copper is etched by the wet etch process. When improvements in electromigration are needed, a Cu layer is introduced under the 2 microns of nickel to improve the current distribution and reduce the peak current density. The Cu layer is then plated first to a thickness of 10 microns, followed by a Ni layer of 2 microns, and a top Cu layer. One of the limitations of this structure is that under severe electromigration testing, the full copper thickness can be consumed, resulting in a failure via a high resistance or electrical open. A potential solution is to increase the thickness of the Cu pillar to be greater than 20 microns. In this manner, the solder is 100% reacted prior to hitting the interface at the bottom of the ball limiting metallurgy. A Cu pillar system at these thicknesses results in a very stiff interconnect, which can produce white bumps at fabrication during traditional tack and reflow processes.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as SMALLTALK, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A three-dimensional (3D) semiconductor memory device, comprising:
    a 3D semiconductor structure having a chip comprising a memory and Through-Silicon Vias (TSVs);
    a hardware accelerator arranged on and coupled face-to-face to the chip, wherein the chip is below the hardware accelerator;
    a substrate arranged under the (3D) semiconductor memory structure and the hardware accelerator and attached to the TSVs and external inputs and outputs of the chip and the hardware accelerator; and
    a supplemental High Bandwidth Memory (HBM) coupled to the substrate and configured to perform memory operations,
    wherein the chip comprising the memory and the TSVs further includes a memory controller for controlling the memory operations, and
    wherein the supplemental HBM is coupled to the substrate using a pre-soldered laminate.

2. The 3D semiconductor memory device of claim 1, wherein the TSVs are arranged at a periphery of the chip.

3. The 3D semiconductor memory device of claim 1, wherein the chip comprising the memory and the TSVs and the hardware accelerator are coupled to form an intermediate structure to which the substrate is attached.

4. The 3D semiconductor memory device of claim 1, wherein the substrate is a packaging substrate comprising a pre-soldered laminate.

5. The 3D semiconductor memory device of claim 1, wherein the chip comprises a Static Random Access Memory.

6. The 3D semiconductor memory device of claim 1, wherein the chip comprising the memory and the TSVs further comprises a HBM Physical (PHY) interface and a HBM memory controller supporting a supplemental HBM and directly electrically coupled to the supplemental HBM using Back End Of Line (BEOL) metal lines.

7. The 3D semiconductor memory device of claim 6, wherein the HBM PHY interface and the HBM memory controller are disposed in an inter-layer dielectric layer of a BEOL of the wafer.

8. The 3D semiconductor memory device of claim 1, wherein the TSVs pass through peripheral regions of the chip.

9. A three-dimensional (3D) semiconductor memory device, comprising:
    a 3D semiconductor structure having a memory chip comprising a memory and Through-Silicon Vias (TSVs);
    a hardware accelerator arranged on and coupled to the memory chip;
    an analog chip, arranged between the memory chip and the hardware accelerator and coupled face-to-face to the hardware accelerator;
    a substrate arranged under the (3D) semiconductor memory structure, the hardware accelerator, and the analog chip, and attached to the TSVs and external inputs and outputs of the memory chip and the hardware accelerator; and
    a supplemental High Bandwidth Memory (HBM) coupled to the substrate and configured to perform memory operations,
    wherein the memory chip comprising the memory and the TSVs further includes a memory controller for controlling the memory operations, and
    wherein the supplemental HBM is coupled to the substrate using a pre-soldered laminate.

10. The three-dimensional (3D) semiconductor memory device of claim 9, wherein the analog chip is coupled to the hardware accelerator using Cu pillars and solder caps.

11. The three-dimensional (3D) semiconductor memory device of claim 9, wherein the analog chip is free of TSVs.

12. The three-dimensional (3D) semiconductor memory device of claim 9, wherein the analog chip comprises one or more TSVs.

13. The three-dimensional (3D) semiconductor memory device of claim 9, wherein the hardware accelerator is coupled to the memory chip by copper pillars used in a copper-to-copper bond.

* * * * *